(12) United States Patent
Kang et al.

(10) Patent No.: US 10,737,289 B2
(45) Date of Patent: Aug. 11, 2020

(54) MASK FRAME ASSEMBLY AND METHOD OF MANUFACTURING DISPLAY APPARATUS BY USING THE SAME

(71) Applicant: Samsung Display Co., Ltd., Yongin-si (KR)

(72) Inventors: Seongjong Kang, Yongin-si (KR); Myoungki Kim, Yongin-si (KR); Jaeyoung Lee, Yongin-si (KR); Jaehoon Hwang, Yongin-si (KR); Jun Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 384 days.

(21) Appl. No.: 15/475,925

(22) Filed: Mar. 31, 2017

(65) Prior Publication Data

US 2017/0282212 A1    Oct. 5, 2017

(30) Foreign Application Priority Data

Mar. 31, 2016    (KR) .......................... 10-2016-0039325

(51) Int. Cl.
| | |
|---|---|
| *B05D 1/32* | (2006.01) |
| *C23C 14/04* | (2006.01) |
| *B05C 21/00* | (2006.01) |
| *H01L 51/00* | (2006.01) |

(52) U.S. Cl.
CPC .............. *B05D 1/32* (2013.01); *B05C 21/005* (2013.01); *C23C 14/042* (2013.01); *H01L 51/0011* (2013.01)

(58) Field of Classification Search
None
See application file for complete search history.

(56) References Cited

U.S. PATENT DOCUMENTS

| | | | |
|---|---|---|---|
| 9,327,310 B2 | 5/2016 | Kang | |
| 2011/0067630 A1 | 3/2011 | Ko et al. | |
| 2015/0007767 A1* | 1/2015 | Ko ........................ | B05C 21/005 |
| | | | 118/504 |
| 2015/0101536 A1* | 4/2015 | Han ...................... | C23C 14/042 |
| | | | 118/721 |

FOREIGN PATENT DOCUMENTS

| | | |
|---|---|---|
| KR | 10-2011-0032284 | 3/2011 |
| KR | 10-2013-0134707 | 12/2013 |
| KR | 10-2015-0006244 | 1/2015 |
| KR | 10-2015-0042600 | 4/2015 |
| KR | 10-2015-0048368 | 5/2015 |

* cited by examiner

*Primary Examiner* — Nathan T Leong
(74) *Attorney, Agent, or Firm* — H.C. Park & Associates, PLC

(57) ABSTRACT

A mask frame assembly including a frame having an opening, a mask having a first end and a second end supported on the frame, and a first member disposed between the first end of the mask and the frame, the first member including a material having a coefficient of thermal expansion greater than that of the mask. A method of manufacturing a display apparatus using the mask frame assembly also is disclosed.

13 Claims, 7 Drawing Sheets

MASK FRAME ASSEMBLY AND METHOD OF MANUFACTURING DISPLAY APPARATUS BY USING THE SAME

CROSS-REFERENCE TO RELATED APPLICATION

This application claims priority from the benefit of Korean Patent Application No. 10-2016-0039325, filed on Mar. 31, 2016, which is hereby incorporated by reference for all purposes as if fully set forth herein.

BACKGROUND

Field

The invention relates generally to a mask frame assembly and a method of manufacturing a display apparatus by using the same, and, more particularly, to a mask frame assembly capable of preventing deformation such as sagging of the mask, and a method of manufacturing a display apparatus by using the mask frame assembly.

Discussion of the Background

As information technology has developed, the market has grown for display apparatuses capable of connecting users and information. Such display apparatuses are being developed in various forms, and from among them, organic light-emitting display apparatuses are gaining attention as desirable display apparatuses due to their low power consumption as well as their slim and lightweight design.

In general, when display apparatuses, including, but not limited to, organic light-emitting display apparatuses are manufactured, various layers are formed by a method such as deposition. For example, during the process of manufacturing an organic light-emitting display apparatus, one or more of a hole injection layer, a hole transport layer, an emission layer, an electron transport layer, an electron injection layer, or the like is/are formed on a substrate by a deposition apparatus. During the process of deposition, material is deposited in a predetermined position on the substrate by using a mask.

However, in the typical method of manufacturing a display apparatus using a mask frame assembly deformation, such as sagging of a mask, may occur during the deposition process.

The above information disclosed in this Background section is only for enhancement of understanding of the background of the inventive concepts, and, therefore, it may contain information that does not form the prior art that is already known in this country to a person of ordinary skill in the art.

SUMMARY

Applicants recognized that in existing mask frame assemblies and methods of manufacturing a display apparatus using such mask frame assemblies deformation, such as sagging of a mask, may occur during a deposition process. The sagging can adversely affect the quality of the pattern formed by the mask.

Mask frame assemblies constructed according to the principles of the invention and methods of manufacturing a display apparatus by using such a mask frame assembly are capable of reducing or preventing deformation such as sagging of the mask. Reducing or eliminating sagging improves the quality of the display, e.g., by improving the resolution of the pattern formed through the use of the mask.

Additional aspects will be set forth in the detailed description which follows, and, in part, will be apparent from the disclosure, or may be learned by practice of the inventive concepts.

According to one aspect of the invention, a mask frame assembly includes a frame having an opening, a mask having a first end and a second end supported on the frame, and a first member disposed between the first end of the mask and the frame, the first member including a material having a coefficient of thermal expansion greater than that of the mask.

The first end of the mask may be coupled to the first member.

The mask frame assembly may further include a second member between the second end of the mask and the frame, the second member including a material having a coefficient of thermal expansion greater than that of the mask.

The second end of the mask may be coupled to the second member.

Each of the first member and the second member may be an integrally formed reinforcing member.

The frame may include a groove in an edge of the frame, and at least a portion of the first member may be inserted in the groove and coupled to the frame.

The first member may extend along an edge of the frame.

The first member may include a plurality of sub members spaced apart along an edge of the frame.

A thickness of the first member may be less than a width of the first member.

The mask may be coupled to the first member.

The mask may be coupled to the first member by one of a screw, pin and groove.

The frame may support the member and the mask for outward movement in response to heat being applied to the mask frame assembly.

The area where the mask is coupled to the first member may move outwardly in in response to heat being applied to the mask frame assembly.

The mask may be welded to the first member.

According to another aspect of the invention, a method of manufacturing a display apparatus includes providing a mask frame assembly having a frame and at least one opening, a mask having an end supported on the frame, and a member disposed between the end of the mask and the frame comprising a material having a coefficient of thermal expansion greater than that of the mask, coupling the mask to the member by a coupling, applying a tensile force to the mask and through the coupling by heating the mask frame assembly such that the mask expands a first distance and the member expands a second distance greater than the first distance, and depositing a deposition material through the at least one opening to a display region of a substrate.

The step of providing a mask frame assembly having an opening may include providing a mask frame assembly having a plurality of openings, and the step of depositing a deposition material over a display region may include simultaneously depositing the deposition material over a plurality of display regions through the plurality of openings.

In the step of applying a tensile force to the mask, the member may be constrained to expand only in an outward direction away from the frame.

In the step of applying a tensile force to the mask, the coupling may move outwardly in response to the heating step.

The coupling may move outwardly from an initial coupling point to a coupling shift point disposed at an outward position away from the frame.

The step of applying a tensile force to the mask may include preventing sagging of the mask.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
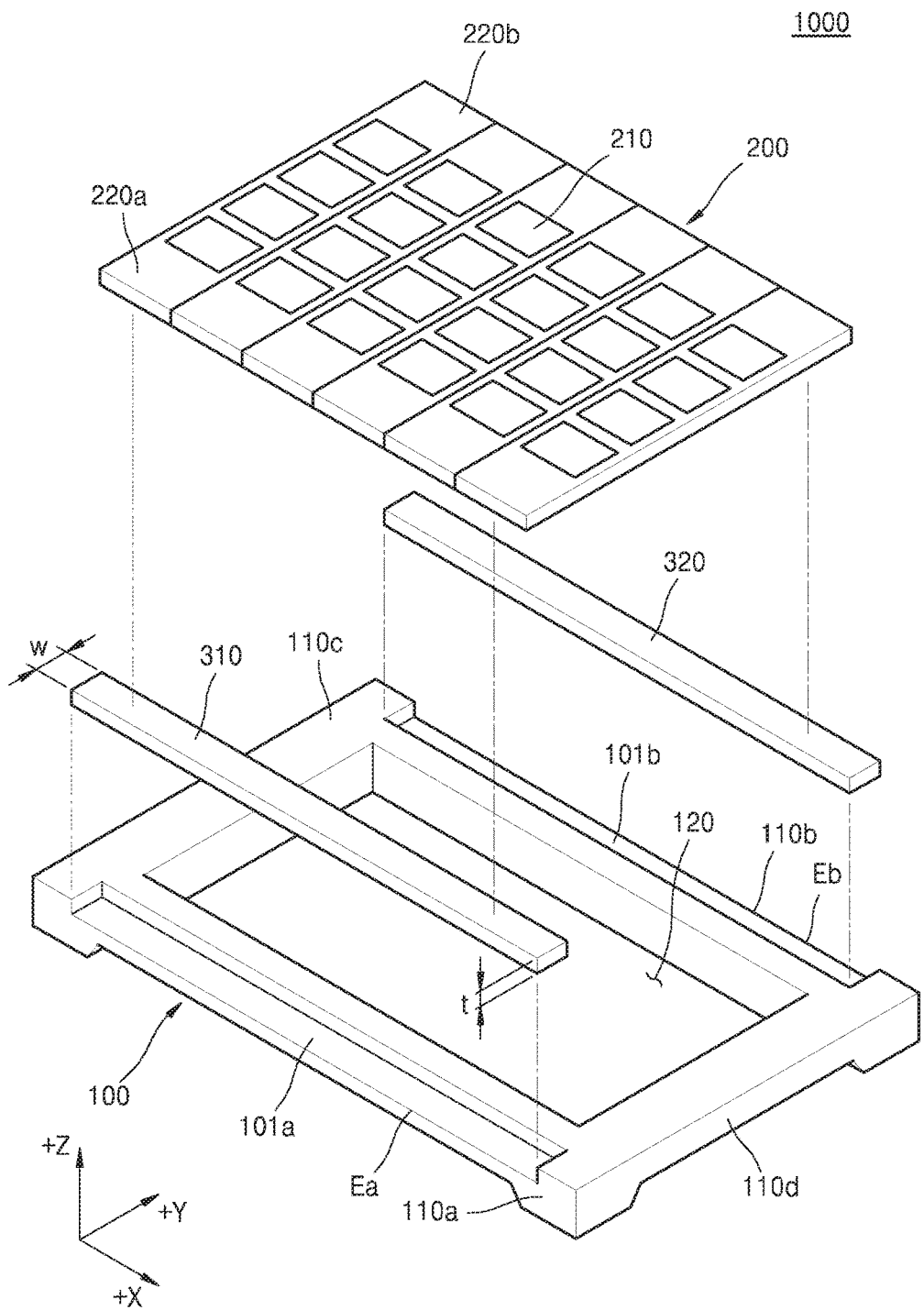
FIG. 1 is an exploded perspective view schematically illustrating a first embodiment of a mask frame assembly constructed according to the principles of the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
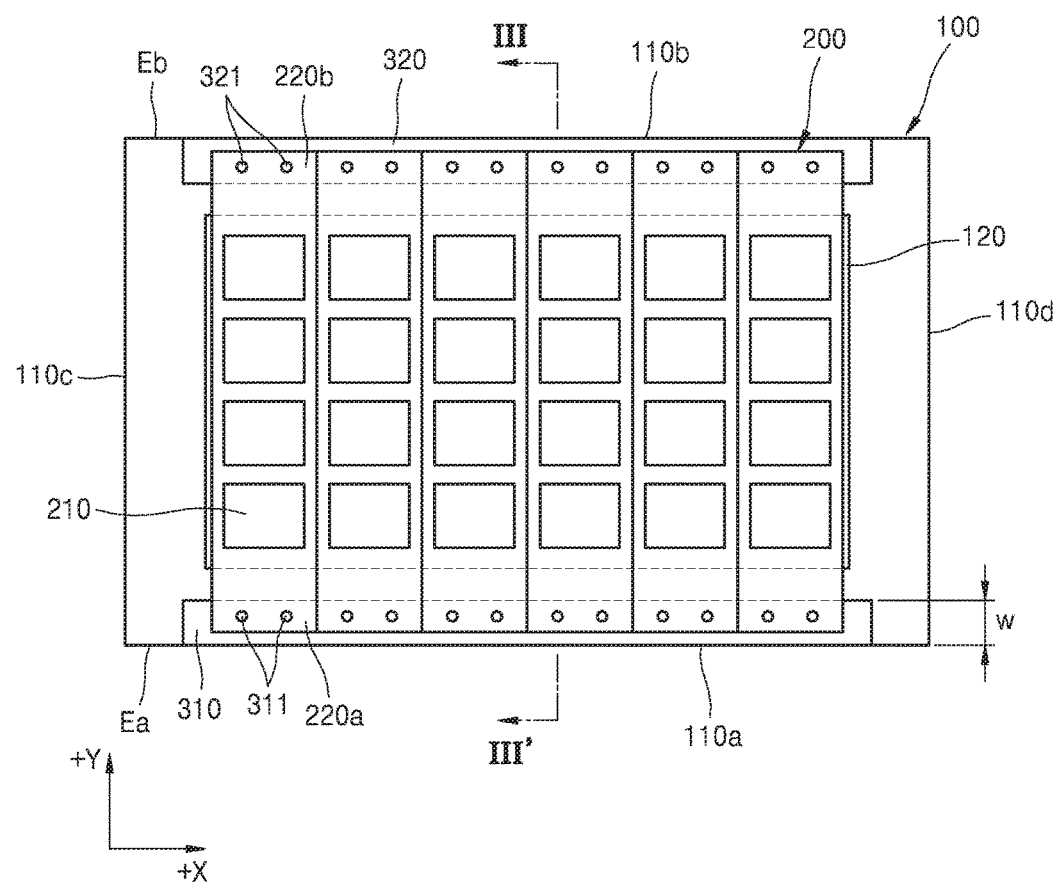
FIG. 2 is a schematic plan view of the mask frame assembly of FIG. 1.

Referring to FIGS. 1 and 2, the mask frame assembly 1000 includes a frame 100, a mask 200, and a first reinforcing member 310. Also, the mask frame assembly 1000 may further include a second reinforcing member 320 disposed on the opposite side of frame 100 facing the first reinforcing member 310.

The frame 100 includes an opening 120 and first to fourth frame members 110a to 110d surrounding the opening 120. Here, the opening 120 may be substantially rectangular, and the frame 100 may also be rectangular overall. That is, the frame 100 may have the first frame member 110a and the second frame member 110b facing each other and the third frame member 110c and the fourth frame member 110d facing each other. For example, the first frame member 110a and the second frame member 110b may extend in a first direction (direction +X), and the third frame member 110c and the fourth frame member 110d may extend in a second direction (direction +Y). As used herein, the direction +X refers to the direction in which the arrows defining the X-axis point and −X refers to the opposite direction along the same line. Likewise, +Y refers to the direction in which the arrows defining the Y-axis point and −Y refers to the opposite direction along the same line. The mask 200 and the first and second reinforcing members 310 and 320 may be coupled to the frame 100. The frame 100 may be formed from or include a highly rigid metal material to prevent excessive deformation when the mask 200 and the first and second reinforcing members 310 and 320 are coupled to the frame 100.

The first reinforcing member 310 and the second reinforcing member 320 are coupled to the frame 100. The first reinforcing member 310 is arranged to correspond to and be supported by the first frame member 110a of the frame 100, and the second reinforcing member 320 is arranged to correspond to and be supported by the second frame member 110b of the frame 100. However, other embodiments may have a different structure. For example, in some embodiments, only one of the first reinforcing member 310 and the second reinforcing member 320 might be coupled to the frame 100.

The first reinforcing member 310 and the second reinforcing member 320 may be coupled to the frame 100 in various ways. For example, the first reinforcing member 310 and the second reinforcing member 320 may be welded to the frame 100 or may be engaged to the frame 100 by a pin, a screw, or some other fastener or fastening method known in the art.

The first reinforcing member 310 may be welded or engaged to the first frame member 110a while the first reinforcing member 310 is inserted in a first groove 101a formed in the first frame member 110a. At least a portion of the first reinforcing member 310 is unrestricted by the first frame member 110a so that the first reinforcing member 310 may be expanded by heat.

The first groove 101a may be at an edge of the first frame member 110a in an opposite direction to the opening 120, that is, at or near an edge Ea in the direction −Y. Thus, the first reinforcing member 310 inserted into the first groove 101a is not restricted in the direction −Y but is restricted in the direction +Y by the first frame member 110a.

Similarly, the second reinforcing member 320 may also be fixed to the second frame member 110b while the second reinforcing member 320 is inserted in a second groove 101b formed in the second frame member 110b.

The second groove 101b may be at an edge of the second frame member 110b in an opposite direction to the opening 120, that is, at or near an edge Eb in the direction +Y. Thus, the second reinforcing member 320 inserted into the second groove 101b is not restricted in the direction +Y but is restricted in the direction −Y by the second frame member 110b.

The mask 200 is coupled to the first and second reinforcing members 310 and 320 coupled to the frame 100, and thus, the first and second reinforcing members 310 and 320 are arranged between the frame 100 and the mask 200.

The first reinforcing member 310 and the second reinforcing member 320 may include a material having a coefficient of thermal expansion greater than that of the mask 200. This prevents or reduces deformation of the mask 200 by using properties of the respective material compositions of the elements such that the first reinforcing member 310 and the second reinforcing member 320 coupled to the mask 200 expand more than the mask 200 in a high-temperature working environment. This will be described below in greater detail with reference to FIGS. 3 and 4.

The first reinforcing member 310 and the second reinforcing member 320 may have various shapes. For example, the first reinforcing member 310 and the second reinforcing member 320 may extend along edges of the frame 100. That is, the first reinforcing member 310 may extend along the edge Ea of the first frame member 110a in the direction +X, and the second reinforcing member 320 may extend along the edge Eb of the second frame member 110b in the direction +X. In other embodiments the first reinforcing member 310 and the second reinforcing member 320 may be coupled to the frame 100 in various shapes and orientations. Other examples thereof will be described later with reference to FIGS. 5 to 7.

The mask 200 extends in one direction (the direction +Y), and both ends of the mask 200 are arranged on the frame members 110a to 110d. In detail, a first end 220a, which is an end of the mask 200 in the direction −Y, is arranged on the first frame member 110a with the first reinforcing member 310 arranged between the first end 220a and the first frame member 110a. Here, the first end 220a of the mask 200 is coupled to the first reinforcing member 310. For example, as shown in FIG. 2, while a bottom surface of the first end 220a of the mask 200 contacts a top surface of the first reinforcing member 310, the first end 220a of the mask 200 may be fixed to the first reinforcing member 310 at a first point 311 by welding, screw coupling, or other means known in the art.

Also, a second end 220b, which is an end of the mask 200 in the direction +Y, is arranged on the second frame member 110b with the second reinforcing member 320 arranged between the second end 220b and the second frame member 110b. As shown in FIG. 2, the second end 220b of the mask 200 may likewise be fixed to the second reinforcing member 320 at a second point 321 by welding, screw coupling, or other means known in the art.

The mask 200 includes deposition regions 210 such as holes that allow deposition material to pass through, and the deposition regions 210 may be arranged in a length direction (the direction +Y) of the mask 200 to overlap the opening 120 of the frame 100 and may include a plurality of sub-openings or a plurality of slits. Thus, the deposition material passing through the opening 120 of the frame and reaching the deposition regions 210 may be selectively deposited on a substrate arranged with the mask 200 in the X and Y directions.

The mask 200 may include split-type mask sticks, and the mask sticks may be narrowly arranged in the direction +X to overlap substantially the entire area of the opening 120 of the frame 100. That is, adjacent edges of neighboring mask sticks are arranged on the frame 100 while the adjacent edges contact or nearly contact each other, and thus, the mask sticks may functionally serve collectively as if they were one integral mask. However, the type of the mask 200 is not limited to the split-type mask sticks. For example, the mask 200 may be an integral mask covering the entire area of the opening 120 of the frame 100.

Hereinafter, a method of preventing deformation of the mask 200 due to heat generated during processes by using a mask frame assembly according to an embodiment will be described with reference to FIGS. 3 and 4.

Figure 3:
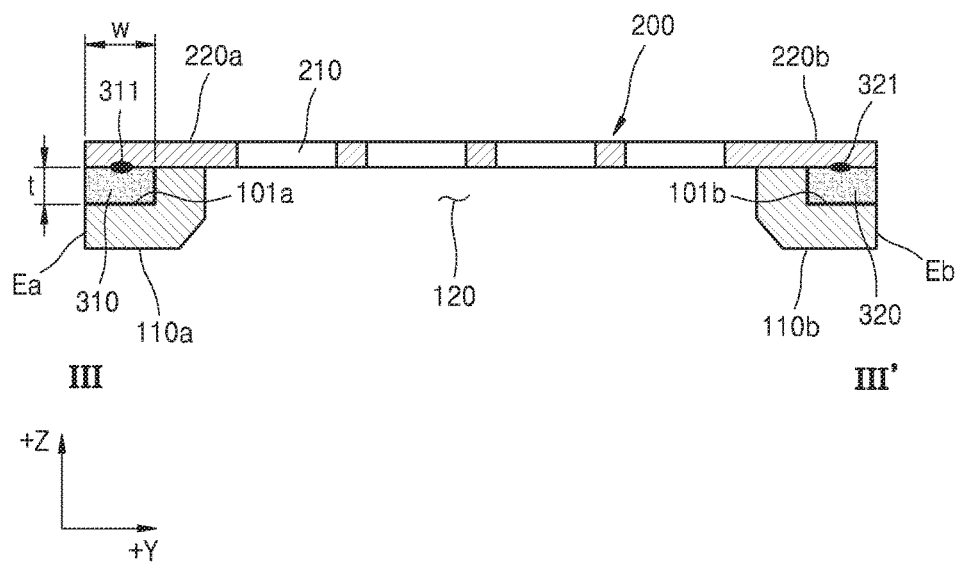
FIG. 3 is a cross-sectional view taken along line III-III' of FIG. 2.

Referring to FIG. 3, the mask 200 is arranged on the frame members 110a and 110b and the first and second reinforcing members 310 and 320 respectively coupled thereto. The first end 220a of the mask 200 is coupled, at the first point 311, to the first reinforcing member 310 coupled to the edge Ea of the first frame member 110a in the direction −Y. Similarly, the second end 220b of the mask 200 is coupled, at the second point 321, to the second reinforcing member 320 and coupled to the edge Eb of the second frame member 110b in the direction +Y. While the mask 200 is stretched tight by applying a tensile force to the mask 200 in the length direction (the direction +Y) of the mask 200, the first end 220a and the second end 220b of the mask 200 are respectively coupled to the first reinforcing member 310 and the second reinforcing member 320. This partially or entirely prevents the mask 200 from sagging in direction −Z, which is toward the frame 100, or deforming due to heat generated during the process. As used herein, the direction +Z refers to the direction in which the arrows defining the Z-axis point and −Z refers to the opposite direction along the same line.

Before the mask frame assembly is exposed to the heat generated during the process, as shown in FIG. 3, the mask 200 is fixed on the first reinforcing member 310 and the second reinforcing member 320 so as to be substantially parallel to the direction +Y without sagging in the direction −Z. However, when the mask 200 undergoes a temperature rise due to the heat generated during the process, the mask 200 is subjected to thermal expansion particularly in the direction +Y and the direction −Y of the mask 200. However, because the first end 220a and the second end 220b of the mask 200 are respectively fixed on the first reinforcing member 310 and the second reinforcing member 320, it is difficult for the mask 200 to expand in an outer direction of the opening 120 of the frame 100. Therefore, the mask 200 sags in the direction −Z to an extent that is proportional to how far the mask 200 has extended in the direction +Y and the direction −Y.

For example, when the mask 200 is used in the deposition process, the deposition process is performed in a high-temperature environment and thus involves thermal expansion of the mask 200. As described above, when deformation such as sagging occurs to the mask 200, adhesion between the mask 200 and a substrate (not shown) arranged on the mask 200 may weaken. Thus, the deposition material might not be properly deposited on a desired region, or a shadow or other defect may occur. Accordingly, one or more embodiments of the invention address these problems by using the first and second reinforcing members 310 and 320.

Figure 4:
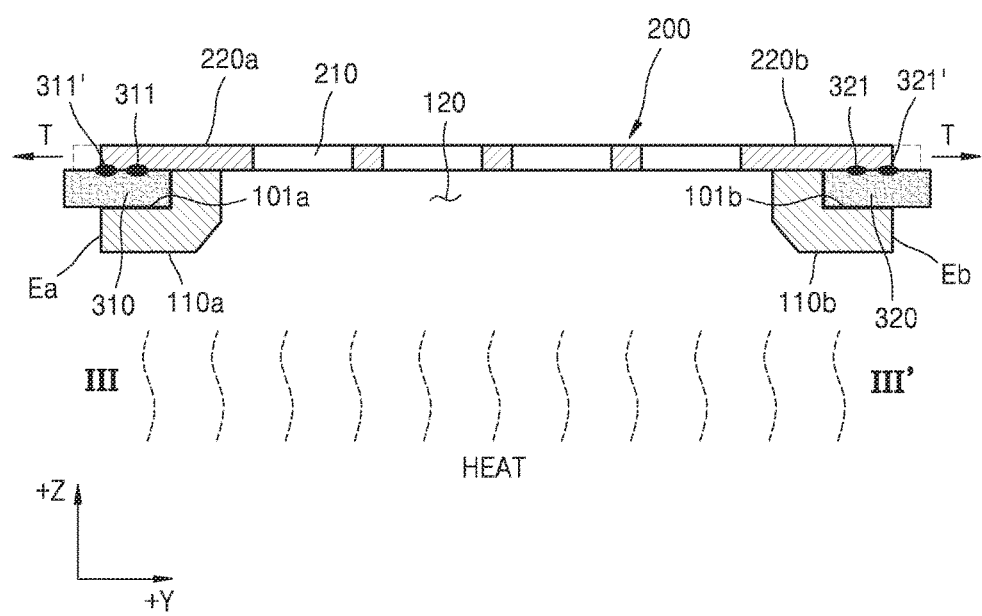
FIG. 4 is the cross-sectional view of FIG. 2 schematically illustrating deformation of the mask frame assembly during a deposition process.

Referring to FIG. 4, when the mask frame assembly is exposed to heat HEAT, represented by the wavy dotted lines, generated during the process, the mask 200 expands outwardly in the directions +Y and −Y. The first reinforcing member 310 and the second reinforcing member 320 respectively coupled to the first end 220a and the second end 220b of the mask 200 also undergo thermal expansion.

The first reinforcing member 310 is inserted in the first groove 101a formed in the edge Ea of the first frame member 110a in the direction −Y, and thus, it is more difficult for the first reinforcing member 310 to expand in the direction +Y toward an inner side of the opening 120 of the frame 100. Accordingly, the first reinforcing member 310 may expand more easily toward an outer side of the opening 120 in the direction −Y that is not restricted by the first frame member 110a. The first reinforcing member 310 may include a material having a coefficient of thermal expansion greater than that of the mask 200 and thus may expand more in the direction −Y than the mask 200 expands in the direction −Y.

As described above, as the first reinforcing member 310 expands more in the direction −Y than the mask 200 expands in the direction −Y, a coupling location between the first reinforcing member 310 and the first end 220a of the mask 200 moves from the first point 311 to a first shift point 311'. Here, the first shift point 311' is shifted in the direction −Y from the location of the first point 311. Thus, a tensile force T is additionally applied to the first end 220a of the mask 200, and an expanded length of the mask 200 in the direction −Y is offset, the mask 200 may be stretched tight in the direction −Y. Accordingly, this additional tensile force T applied to the mask 200 may prevent or reduce the extent of the mask 200 sagging in the direction −Z.

Similarly, the second reinforcing member 320 is also inserted in the second groove 101b formed in the edge Eb of the second frame member 110b in the direction +Y, and thus, it is more difficult for the second reinforcing member 320 to expand in the direction −Y toward the inner side of the opening 120 of the frame 100. Accordingly, the second reinforcing member 320 may expand outwardly more easily in the direction +Y toward and away from the outer side of the opening 120 that is not restricted, i.e. defined, by the second frame member 110b. The second reinforcing member 320 may include a material having a coefficient of thermal expansion greater than that of the mask 200 and thus may expand more in the direction +Y than the mask 200 expands in the direction +Y.

As described above, as the second reinforcing member 320 expands more in the direction +Y than the mask 200 expands in the direction +Y, the coupling location between the second reinforcing member 320 and the second end 220b of the mask 200 moves from the second point 321 to a second shift point 321'. The second shift point 321' is located more in the direction +Y than the second point 321. Thus, since the tensile force T is additionally applied to the second end 220b of the mask 200, and a length of the mask 200 that expands in the direction +Y is offset, the mask 200 may be stretched tighter in the direction +Y as a result of the second reinforcing member 320 expanding more in the +Y direction than the mask 200. Accordingly, the mask 200 may thereby be prevented from, or experience reduced sagging in the direction −Z.

The thickness t of the first and second reinforcing members 310 and 320 may be less than widths w of the first and second reinforcing members 310 and 320 so that the first and second reinforcing members 310 and 320 may expand toward the outer side of the opening 120 of the frame 100 more easily than they would if they were thicker. Here, the thicknesses t of the first and second reinforcing members 310 and 320 refer to the dimension in direction Z, and the widths w of the first and second reinforcing members 310 and 320 refer to the dimension in the direction Y. In general, the coefficient of expansion due to a temperature rise increases as the length of a member increases, and accordingly, as the thicknesses t of the first and second reinforcing members 310 and 320 decreases, the widths w of the first and second reinforcing members 310 and 320, that is, the lengths of the first and second reinforcing members 310 and 320 in the Y direction may increase.

As described above, when a mask frame assembly constructed according to the principles of the invention is used, deformation, such as sagging, of the mask 200 may be reduced even in a high-temperature deposition process, thus allowing the mask 200 to maintain a more horizontal state, substantially parallel to the plane of the X-Y axes. Accordingly, adhesion between the mask 200 and the substrate arranged on the mask 200 may improve, thereby improving the resolution of the pattern formed on the substrate through the use of the inventive mask.

Figure 5:
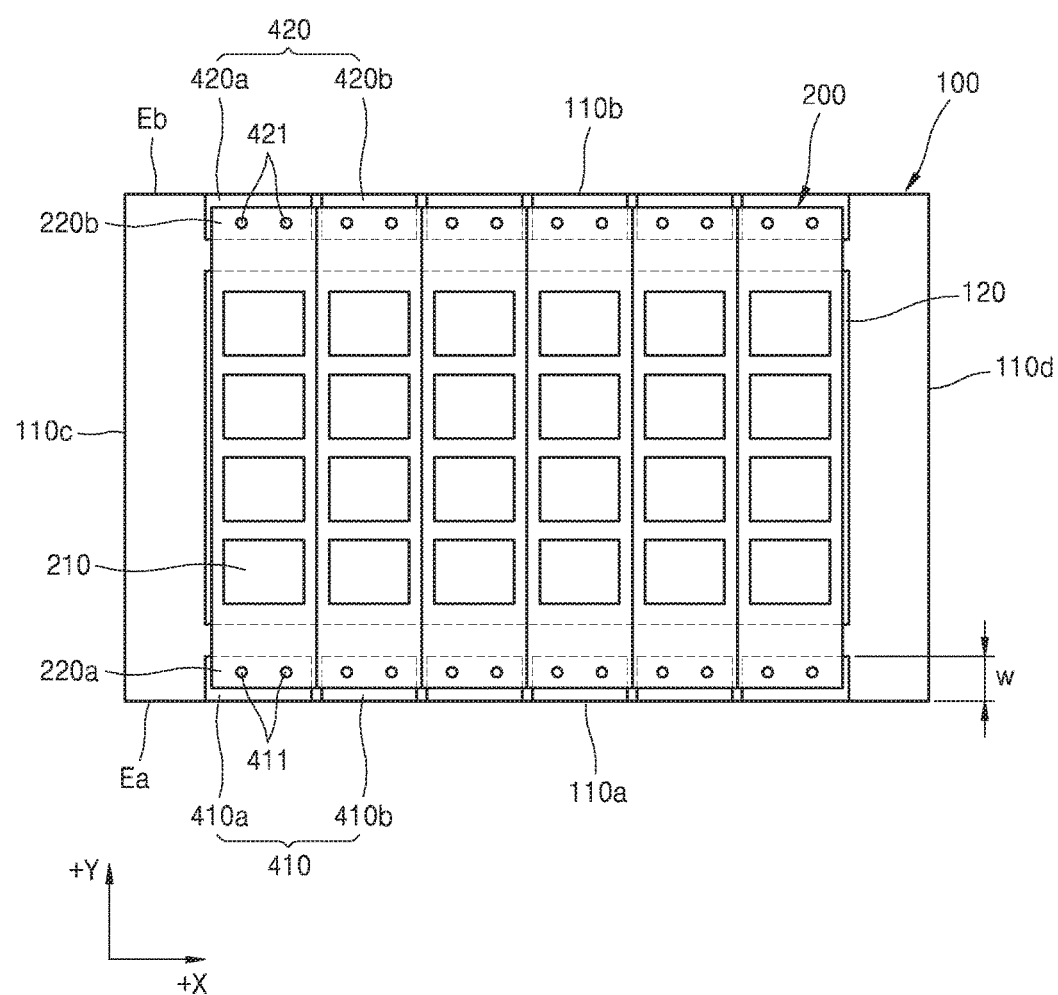
FIG. 5 is a plan view schematically illustrating a second embodiment of a mask frame assembly composed of a plurality of split-type mask sticks constructed according to the principles of the invention.
Figure 6:
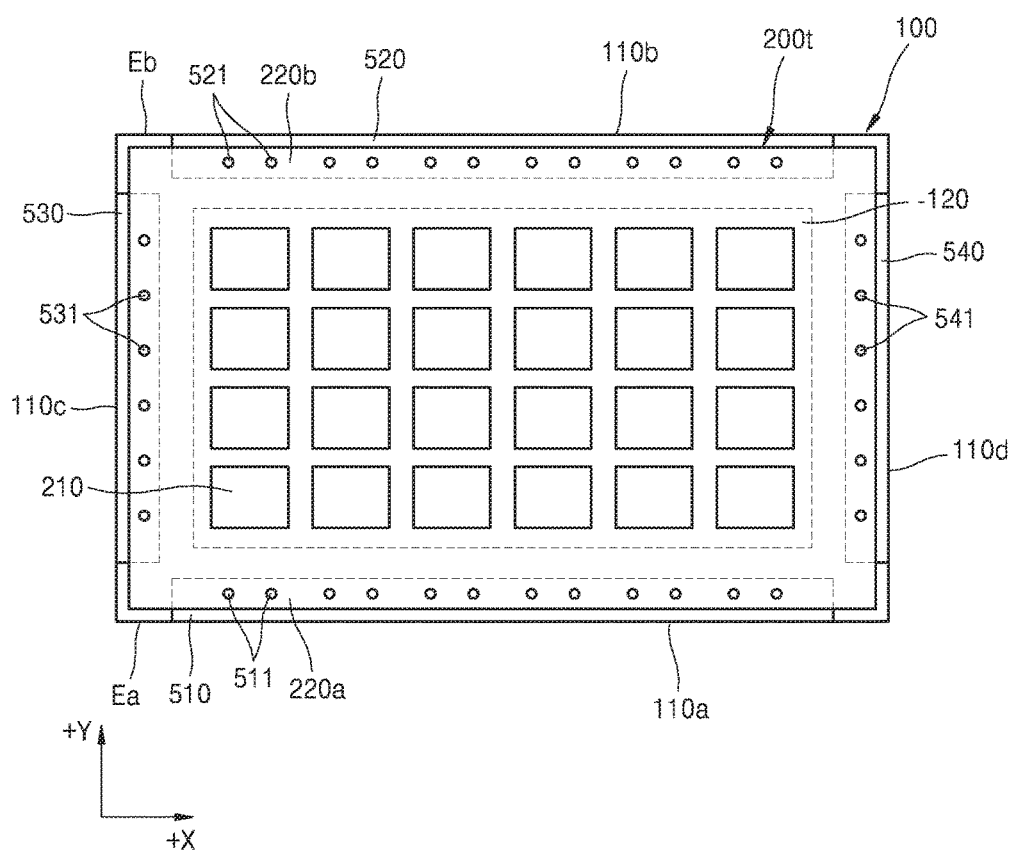
FIG. 6 is a plan view schematically illustrating a third embodiment of an integral type of mask frame assembly constructed according to the principles of the invention.
Figure 7:
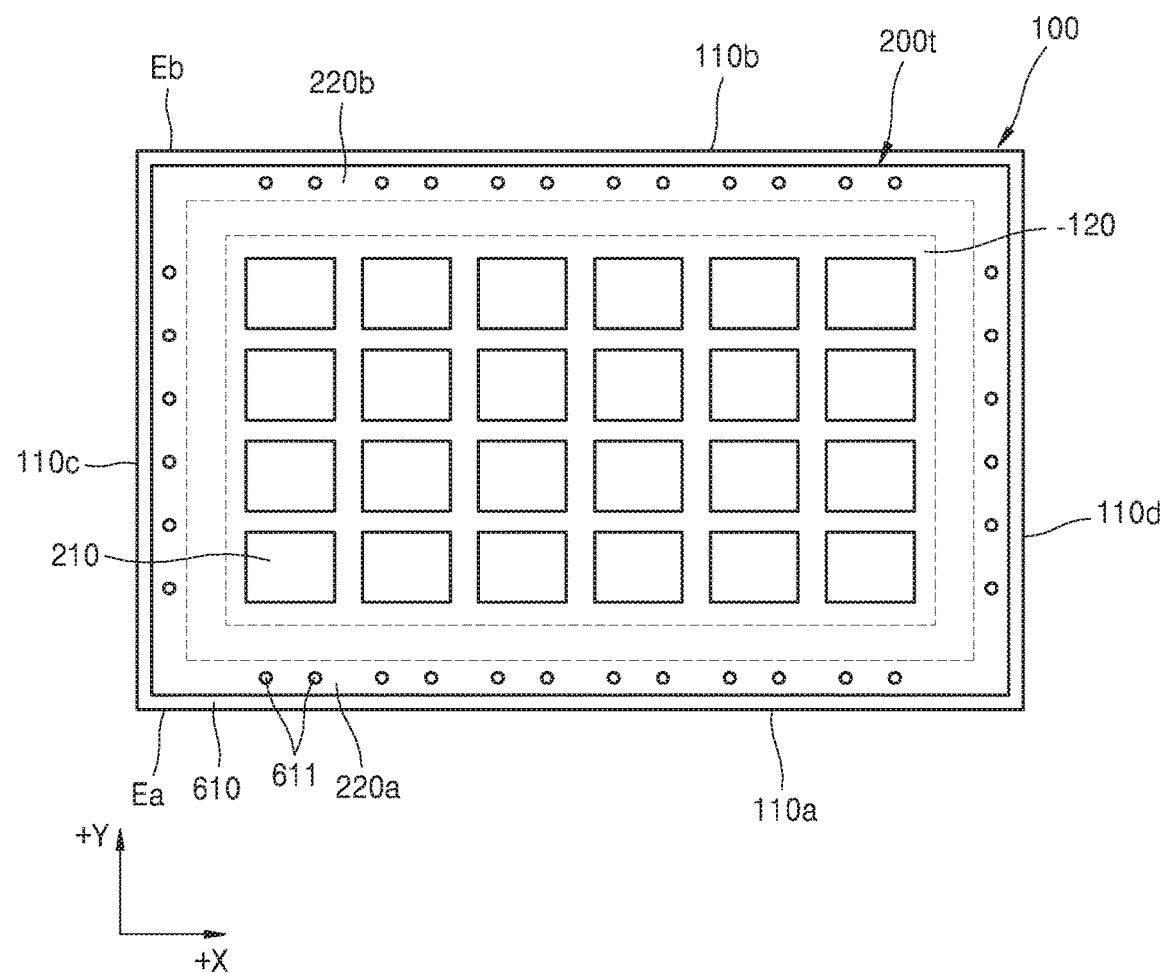
FIG. 7 is a plan view schematically illustrating a fourth embodiment of an integral type of mask frame assembly constructed according to the principles of the invention.

Since the embodiments shown in FIGS. 5 to 7 are obtained by partially modifying shapes of the mask 200 and the first and second reinforcing members 310 and 320 from the embodiments shown in FIGS. 1 to 4, descriptions already made with reference to FIGS. 1 to 4 will be omitted herein to avoid redundancy.

Referring to FIG. 5, a first reinforcing member 410 and a second reinforcing member 420 may each include a plurality of sub members. That is, a first sub member 410a and a second sub member 410b adjacent to the first sub member 410a which are included in the first reinforcing member 410 may be spaced apart along the edge Ea of the first frame member 110a in the X direction. For example, the first sub member 410a may be coupled to an end of the mask 200 in the Y direction at first points 411 arranged along the edge Ea of the first frame member 110a. The same is true for the second sub member 410b. The above structure in which a mask includes a plurality of split-type mask sticks, and the plurality of sub members respectively correspond to the plurality of sub members one-on-one allows easier expansion in the direction −Y, compared to a structure of the first reinforcing member 310 of FIG. 2 having a singular strip shape. FIG. 5 illustrates three pairs of reinforcing members 410, each comprised of two sub members 410a and 410b, disposed along one edge of the mask in the X direction. Of course other numbers and arrangements of reinforcing members are possible.

The second reinforcing member 420 may also include a third sub member 420a and a fourth sub member 420b adjacent to the third sub member 420a, and the third sub member 420a and the fourth sub member 420b may be spaced apart along the edge Eb of the second frame member 110b in the X direction. For example, the third sub member 420a may be coupled to an end of the mask 200 in the Y direction at second points 421 arranged along the edge Eb of the second frame member 110b. The same is true for the fourth sub member 420b. Thus, the third sub member 420a and the fourth sub member 420b may expand in the direction +Y more easily than the second reinforcing member 320 of FIG. 2 having a singular strip shape. FIG. 5 illustrates three pairs of reinforcing members 420, each comprised of two sub members 420a and 420b, disposed along one edge of the mask in the X direction. Of course other numbers and arrangements of reinforcing members are possible.

Referring to FIG. 6, a mask 200t may be an integral mask overlapping the entire area of the opening 120 of the frame 100. Here, the mask 200t may be coupled to a first reinforcing member 510 and a second reinforcing member 520 facing each other and extending in the direction +X, and may be coupled to a third reinforcing member 530 and a fourth reinforcing member 540 facing each other and extending in the direction +Y. In detail, the first reinforcing member 510 may be coupled to an end of the mask 200t in the direction −Y at first points 511 arranged along the edge Ea of the first frame member 110a, and the second reinforcing member 520 may be coupled to an end of the mask 200t in the direction +Y at second points 521 arranged along the edge Eb of the second frame member 110b.

Similarly, the third reinforcing member 530 may be coupled to an end of the mask 200t in the direction −X at third points 531 arranged along an edge of the third frame member 110c, and the fourth reinforcing member 540 may be coupled to an end of the mask 200t in the direction +X at fourth points 541 arranged along an edge of the fourth frame member 110d. Thus, the mask 200t may stretch in the direction +X and/or the direction −X and at the same time, may stretch in the direction +Y and/or the direction −Y, thereby reducing sagging of the entire surface of the mask 200t in the direction −Z.

Referring to FIG. 7, the mask 200t may be an integral mask overlapping the entire area of the opening 120 of the frame 100, and the mask 200t may be coupled to a reinforcing member 610 surrounding the entire edge of the frame 100 at coupling points 611 arranged along the entire edge of the frame 100. The reinforcing member 610 may be obtained by integrally forming a first reinforcing member and a second reinforcing member shown as being separate from each other in the previous embodiments, and the reinforcing member 610 may form a closed looped shape, such as a regular polygon, corresponding to a shape of the frame 100. As in the embodiment shown in FIG. 6, the reinforcing member 610 may allow the mask 200t to stretch in the direction +X and/or the direction −X and at the same time, stretch in the direction +Y and/or the direction −Y, thereby reducing sagging of the entire surface of the mask 200t in the direction −Z.

Figure 8:
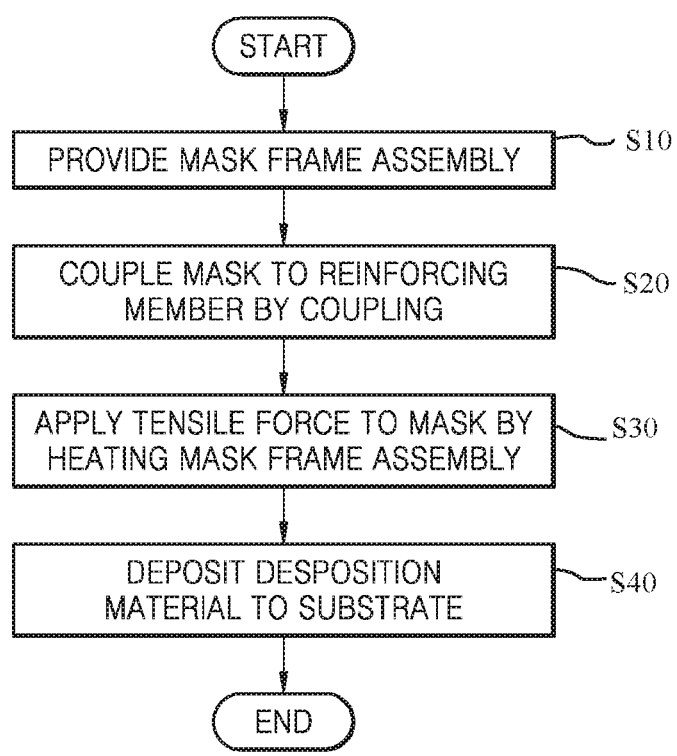
FIG. 8 is a flow chart illustrating a method of manufacturing a display apparatus using the mask frame assembly constructed according to the principles of the invention.

FIG. 8 is a flow chart illustrating a method of manufacturing a display apparatus using the mask frame assembly constructed according to the principles of the invention. As shown in FIG. 8, at Step S10, the mask frame assembly 1000 having a frame 100 and at least one opening, the mask 200 having an end supported on the frame 100, and a reinforcing member disposed between the end of the mask and the frame 100 are provided. The mask 200 is coupled to the member by a coupling at Step S20. At Step S30, a tensile force is then applied to the mask 200 through the coupling by heating the mask frame assembly 1000 such that the mask 200 expands a first distance and the reinforcing member expands a second distance greater than the first distance. At Step S40, deposition material is deposited through the opening to a display region of the substrate.

Although a mask frame assembly has been described in connection with four specific embodiments, the inventive concepts are not limited thereto. Thus, a method for manufacturing a display apparatus by using such a mask frame assembly, or a display apparatus manufactured by the method are also included in the scope of the inventive concepts. The display apparatus manufacturing method according to one aspect of the invention includes preparing a substrate, and simultaneously depositing a deposition material over a plurality of display regions of the substrate by using a mask frame assembly according to one of the above-described examples or alternatives thereto, and thus may be used to simultaneously form a plurality of pixels or a plurality of display apparatuses. In this regard, simultaneously depositing deposition materials may include, for example, in the case of manufacturing an organic light-emitting display apparatus, forming a hole injection layer, a hole transport layer, an emission layer, an electron transport layer, an electron injection layer, and/or similar layers.

As described above, according to one or more embodiments of the invention, a mask frame assembly, and a method of manufacturing a display apparatus by using the mask frame assembly, is capable of forming a higher resolution pattern by reducing or preventing deformation, such as sagging of a mask.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A mask frame assembly comprising:
   a frame having an opening and a groove in an edge of the frame;
   a mask having a first end and a second end supported on the frame; and
   a first member disposed between the first end of the mask and the frame, the entire first member being disposed on the frame and inserted in the groove, and the first member comprising a material having a coefficient of thermal expansion greater than that of the mask,
   wherein a first portion of the groove close to the opening is separated from the opening by the frame, and a second portion of the groove far from the opening is completely penetrated.

2. The mask frame assembly of claim 1, wherein the first end of the mask is coupled to the first member.

3. The mask frame assembly of claim 1, further comprising a second member between the second end of the mask and the frame, the entire second member being disposed on the frame, and the second member comprising a material having a coefficient of thermal expansion greater than that of the mask.

4. The mask frame assembly of claim 3, wherein the second end of the mask is coupled to the second member.

5. The mask frame assembly of claim 3, wherein each of the first member and the second member comprises an integrally-formed reinforcing member.

6. The mask frame assembly of claim 1, wherein the first member extends along an edge of the frame.

7. The mask frame assembly of claim 1, wherein the first member comprises a plurality of sub members spaced apart along an edge of the frame.

8. The mask frame assembly of claim 1, wherein a thickness of the first member is less than a width of the first member.

9. The mask frame assembly of claim 1, wherein the mask is coupled to the first member.

10. The mask frame assembly of claim 9, wherein the mask is coupled to the first member by one of a screw, pin and groove.

11. The mask frame assembly of claim 9, wherein an area where the mask is coupled to the first member moves outwardly in a horizontal direction in response to heat being applied to the mask frame assembly.

12. The mask frame assembly of claim 1, wherein the frame supports the first member and the mask for outward movement in a horizontal direction in response to heat being applied to the mask frame assembly.

13. The mask frame assembly of claim 1, wherein the mask is welded to the first member.

* * * * *